(12) United States Patent
Park et al.

(10) Patent No.: US 7,160,823 B2
(45) Date of Patent: Jan. 9, 2007

(54) LOW DIELECTRIC CONSTANT LOW TEMPERATURE FIRED CERAMICS

(75) Inventors: Jae-Hwan Park, Seoul (KR); Jae-Gwan Park, Seoul (KR); Dong-Soon Shin, Seoul (KR); Young-Jin Choi, Seoul (KR)

(73) Assignee: Korea Institute of Science and Technology (KR)

( * ) Notice: Subject to any disclaimer, the term of this patent is extended or adjusted under 35 U.S.C. 154(b) by 155 days.

(21) Appl. No.: 10/637,311

(22) Filed: Aug. 7, 2003

(65) Prior Publication Data

US 2004/0198580 A1 Oct. 7, 2004

(30) Foreign Application Priority Data

Apr. 2, 2003 (KR) .................... 10-2003-0020800

(51) Int. Cl.
*C03C 14/00* (2006.01)
*C03C 8/22* (2006.01)
*C03C 8/02* (2006.01)

(52) U.S. Cl. .................. 501/32; 501/17; 501/21
(58) Field of Classification Search ........... 501/17, 501/21, 32
See application file for complete search history.

(56) References Cited

U.S. PATENT DOCUMENTS

| | | | | |
|---|---|---|---|---|
| 4,593,006 A * | 6/1986 | Takabatake et al. | ......... | 501/32 |
| 4,755,490 A * | 7/1988 | DiLazzaro | .............. | 501/17 |
| 5,079,194 A * | 1/1992 | Jean et al. | ............. | 501/17 |
| 5,141,899 A * | 8/1992 | Jean et al. | ............. | 501/18 |
| 5,164,342 A * | 11/1992 | Muralidhar et al. | ......... | 501/20 |
| 5,206,190 A * | 4/1993 | Jean et al. | ............. | 501/32 |
| 5,242,867 A | 9/1993 | Lin et al. | ............. | 501/32 |
| 5,270,268 A * | 12/1993 | Jean et al. | ............. | 501/32 |
| 5,747,396 A | 5/1998 | Miyakoshi et al. | ......... | 501/32 |
| 5,756,408 A * | 5/1998 | Terashi et al. | ............. | 501/8 |
| 5,786,288 A * | 7/1998 | Jean | ............. | 501/16 |
| 6,133,175 A * | 10/2000 | Bethke et al. | ............. | 501/8 |
| 6,737,374 B1 * | 5/2004 | Bedard | ............. | 501/32 |
| 2002/0039645 A1 * | 4/2002 | Kawai et al. | ............. | 428/210 |

FOREIGN PATENT DOCUMENTS

JP  2003-26446 A  *  2/2003

OTHER PUBLICATIONS

Definition of Alkaline Earth Metal from the website Wikipedia.*
Derwent Abstract 2003-620905. abstract of JP 2003-026446A.*
Machine Translation of JP 203-026446.*
Ceramics International 28(2002)123-130, M.F. Zawrah, E.M.A. Hamzawy, "Effect of Cristobalite Formation on Sinterability, Microstructure and Properties of Glass/Ceramic Composites".
Materials Science and Engineering B99 (2003) 597-600, Shao-hong Wang, He-ping Zhou, "Densification and Dielectric Properties of $CaO$—$B_2O_3$—$SiO_2$ System Glass Ceramics".

* cited by examiner

*Primary Examiner*—J. A. Lorengo
*Assistant Examiner*—Elizabeth A. Bolden
(74) *Attorney, Agent, or Firm*—Ostrolenk, Faber, Gerb & Soffen, LLP

(57) ABSTRACT

Low dielectric constant dielectric ceramics for a borosilicate-based low temperature fired multi-layer substrate is disclosed which can be fired at a wide temperature range of above and below 900° C. and exhibits a low loss electrical property. By controlling the types and addition amount of the alkaline earth metal oxide, the linear shrinkage behavior can be considerably controlled while maintaining the electrical property unchanged. The composition facilitates matching a linear shrinkage with a heterogeneous material having certain shrinkage characteristics.

4 Claims, 2 Drawing Sheets

LOW DIELECTRIC CONSTANT LOW TEMPERATURE FIRED CERAMICS

BACKGROUND OF THE INVENTION

1. Field of the Invention

The present invention relates to a dielectric ceramics and its fabrication method, and more particularly, to a low dielectric constant dielectric ceramics for a borosilicate-based low temperature fired multi-layer substrate which can be fired at a wide temperature range above and below 900° C. and exhibits a low loss electrical property.

2. Description of the Background Art

With the development in the mobile communication and information communication field, techniques for making electronic parts compact and light emerge as key factors, for which a metallization density of a substrate needs to be heightened and individual parts or size and weight of a module needs to be reduced.

Utilization of a low temperature co-fired ceramic (LTCC) technique would lead to integration of a high-density metallization substrate and various types of passive parts, so that compact and light composite parts can be fabricated.

The LTCC technique is a material and process technique where a ceramic thick film tape with a device and a circuit printed thereon is stacked and an electrode is three-dimensionally connected, which is then co-fired at a low temperature of below 950° C. to obtain an integrated ceramic multi-layer circuit structure.

Because the LTCC substrate is fired at the temperature of below 950° C., Ag can be used as an internal electrode. Thus, it is less expensive compared to a precious metal internal electrode such as Pt used for the existing ceramic multi-layer substrate and has a superior electric conductivity.

In addition, diverse passive parts such as 'L', 'C', 'R', or the like, are stacked as a thick film tape type and connected through the internal electrode and a via hole, whereby the ceramic thick film parts, which have been individualized as a surface mounting device (SMD), are integrated to implement one module.

The most basic one of composition constituting the LTCC is a glass composition forming a metallization substrate having a low dielectric constant and a low dielectric loss. Such a composition contains 50–90 wt % of borosilicate-based glass composition and a filler such as 10–50 wt % of $Al_2O_3$ and $SiO_2$.

The glass is softened at a temperature of below 700° C., forms a liquid phase near 850° C. and densificated at a temperature of 850–950° C. The filler serves to constantly maintain the shape of subscriber during a firing process and increase a mechanical intensity of a fired body.

Specifically, as the glass composition, borosilicate-based glass with a small amount of alkali oxide is commonly used thanks to its low dielectric loss value.

For example, a U.S. Pat. No. 5,242,867 discloses a composition for LTCC metallization substrate. In this art, a glass composition contains 60–80% of $SiO_2$ and 15–30% of $B_2O_3$ as primary composition and $Al_2O_3$ of below 5% and alkali are added thereto, and as a filter, alumina is used. A mixture ratio of the filter to the glass composition is 20–60%, and $Na_2O$, $K_2O$, $Li_2O$, etc. are added as alkali to the glass composition. The substrate fabricated by the composition has characteristics of having a dielectric constant of 4.2–5.6 and a dielectric loss of 0.1–0.4%.

Similar compositions have been also presented, but most of them contain alkali ($R_2O$), causing a problem that a dielectric loss value is high, that is, above 0.1%, even though they are advantageous for glass melting.

SUMMARY OF THE INVENTION

Therefore, an object of the present invention is to provide ceramics which is able to easily form glass and has a quite low dielectric loss.

Another object of the present invention is to provide ceramics that is capable of controlling a linear shrinkage behavior in a wide range.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

The present invention is to provide a composition with a low dielectric loss value by adding only an alkaline earth metal oxide (RO), rather than adding alkali oxide ($R_2O$). The alkaline earth metal oxide is somewhat disadvantageous in forming glass compared to alkali oxide, but it is anticipated that it has a better electricity insulation.

In the LTCC technique, because diverse types of material compositions such as 'L', 'C', 'R', or the like, should be fired together, a linear shrinkage behavior of the glass composition for metallization substrate needs to be controlled at a temperature of 850–950° C.

The ceramics of the present invention basically contain $SiO_2$ and $B_2O_3$ as a primary composition and $Al_2O_3$ is added thereto. In addition, an additive consisting of zinc oxide (ZnO) and alkaline earth metal oxides (RO), where RO is selected from the group consisting of MgO, CaO and SrO, are also added thereto.

Specifically, the composition comprises: a borosilicate-based glass composition comprising 68–72 mol % of $SiO_2$, 20–24 mol % of $B_2O_3$, 4–12 mol % of $Al_2O_3$ and alkaline earth metal oxide; and $Al_2O_3$ as a filler.

The alkaline earth metal oxide is a material of one or more selected from the group consisting of MgO, CaO and SrO.

A fabrication method of a low dielectric constant glass substrate includes: weighing, ball-milling, drying and crushing material powder of $SiO_2$, $B_2O_3$, $Al_2O_3$, MgO, CaO, SrO and ZnO; putting the powder in a platinum furnace and melting them at a temperature of 1400–1600° C.; injecting the melted material to a quenching roller to quench it and obtain platy glass; crushing the glass plate to obtain glass frit powder; mixing the glass powder and alumina, a filler, in an adequate ratio; shaping the mixed powder with a predetermined pressure; and sintering the shaped body at a temperature of 850–950° C.

Figure 1:
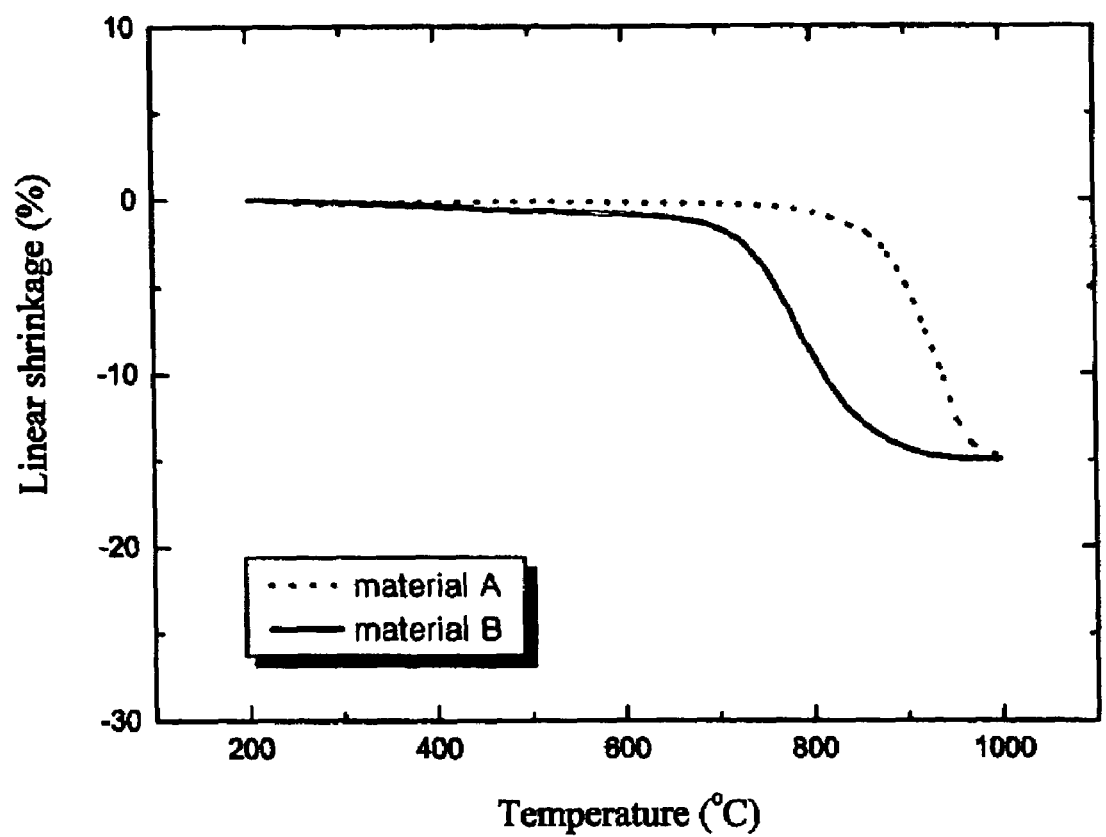
FIG. 1 is a graph showing linear shrinkage curves of a heterogeneous material.

FIG. 1 shows two types of linear shrinkage curves of a heterogeneous material.

In case of a low dielectric constant glass substrate, its composition can be implemented to make a sufficient linear shrinkage usually at a temperature of below 800° C. (material 'B').

However, in case of a high dielectric constant dielectric substrate required for implementing an internal capacity in the LTCC or in case of an 'L' substrate, sintering is not well performed and the linear shrinkage takes place at a temperature of above 900° C. (material 'A'). Thus, if the two or more materials with different on-set temperatures for the linear shrinkage are co-fired, the materials are broken down as its interface is separated.

The present invention provides a low dielectric constant glass substrate composition of which linear shrinkage behavior is controlled to be wide while its electrical property remain almost the same by controlling an alkaline earth composition and content change. A metallization substrate with such characteristics is expected to be easily matched of linear shrinkage with a heterogeneous material.

The present invention will now be described in detail through embodiments

Embodiment 1

First compositions such as below Table 1 was checked in order to determine an adequate mixture ratio between $SiO_2$ and $B_2O_3$ which largely affect glass formation and its characteristics.

In a state that a content amount of $Al_2O_3$ and alkaline earth metal oxide was fixed constant, the content of $SiO_2$ was changed to 62–72% and the content of $B_2O_3$ was changed proportionally.

Among alkaline earth metal oxide, MgO and CaO were selected and added in the same ratio.

First, it was checked whether glass melting is properly made at a temperature of 1600° C., and a glass transition temperature (Tg) and a softening temperature (Ts) were checked from an inflection point measured by a dilatometer.

And then, an electrode was formed at a glass pallet and its electrical property was measured by an LCR meter, a result of which are as shown in below Table 1.

TABLE 1

| Sample No | Glass Composition (Mole %) | | | | | Melting (at 1600° C.) | Tg (° C.)/ Ts (° C.) | Physical and electrical properties | |
|---|---|---|---|---|---|---|---|---|---|
| | $SiO_2$ | $B_2O_3$ | $Al_2O_3$ | MgO | CaO | | | dielectric constant (@ 1 MHz) | dielectric loss (%) (@ 1 MHz) |
| 1A | 62.00 | 30.00 | 2.00 | 3.00 | 3.00 | ○ | 521/617 | 4.21 | 0.23 |
| 1B | 66.00 | 26.00 | 2.00 | 3.00 | 3.00 | ○ | 557/651 | 4.23 | 0.15 |
| 1C | 70.00 | 22.00 | 2.00 | 3.00 | 3.00 | ○ | 610/705 | 4.26 | 0.09 |
| 1D | 74.00 | 18.00 | 2.00 | 3.00 | 3.00 | Δ | 701/799 | 4.28 | 0.21 |

In case that the content of $SiO_2$ is 74%, a viscosity is high even at the melting temperature of 1600° C., making it difficult to fabricate glass. The melting process using a platinum furnace or a precious metal furnace is requisite for the fabrication of glass.

But, as noted, if the temperature is above 1600° C., several problems arise such as, for example, platinum is oxidized. Accordingly, it is preferred to select glass composition that can be melt at a lower temperature than 1600° C. Therefore, it is noted that, preferably, an addition amount of $SiO_2$ should be maintained below 74%.

In addition, in terms of electrical property, it is observed that when the content of $SiO_2$ is changed, there is no change in the dielectric constant, while in case of the dielectric loss, it is the lowest when the addition amount of $SiO_2$ is about 70%.

Consequently, an adequate addition amount of $SiO_2$ is judged to be in the range of 68–72%, so that in the follow-up embodiments, the content of $SiO_2$ is fixed at 70% while the alkali composition is changed.

Embodiment 2

The content of $SiO_2$ was fixed at 70% and the content of $B_2O_3$ and $Al_2O_3$ was constantly maintained. Alkaline earth metal oxide was changed to MgO, CaO, SrO and ZnO and their characteristics were checked. Table 2 exhibits physical and electrical properties.

TABLE 2

| Sample No | Glass Composition (Mole %) | | | | | | | Melting (at 1600° C.) | Tg (° C.)/ Ts (° C.) | dielectric constant (@ 1 MHz) | dielectric loss (%) (@ 1 MHz) |
|---|---|---|---|---|---|---|---|---|---|---|---|
| | $SiO_2$ | $B_2O_3$ | $Al_2O_3$ | MgO | CaO | SrO | ZnO | | | | |
| 2A | 70.00 | 22.00 | 2.00 | 3.00 | 3.00 | — | — | crystallization | 610/705 | 4.26 | 0.21 |
| 2B | 70.00 | 22.00 | 2.00 | 3.00 | — | 3.00 | — | ○ | 614/712 | 4.33 | 0.25 |
| 2C | 70.00 | 22.00 | 2.00 | 3.00 | — | — | 3.00 | crystallization | 597/705 | 4.10 | 0.17 |
| 2D | 70.00 | 22.00 | 2.00 | — | 3.00 | 3.00 | — | ○ | 687/757 | 4.43 | 0.15 |
| 2E | 70.00 | 22.00 | 2.00 | — | 3.00 | — | 3.00 | ○ | 637/718 | 4.20 | 0.05 |
| 2F | 70.00 | 22.00 | 2.00 | — | — | 3.00 | 3.00 | Δ | 638/718 | 4.28 | 0.17 |

Addition of MgO is judged to be not preferred because glass is not formed during the process of quenching a melt glass and instead crystallization was made.

Addition of SrO is judged to be also not preferred because it happens that the glass transition temperature (Tg) is too high or glass melting itself is not possible.

Meanwhile, addition of CaO and ZnO facilitates glass melting and exhibits a low dielectric loss when their electrical properties were measured.

As a result, it is noted that CaO is more suitable as an alkaline earth metal oxide. Also suitable is ZnO.

Embodiment 3

The content of $SiO_2$ was fixed at 70% and the contents of $B_2O_3$ and $Al_2O_3$ were also maintained constant. ZnO and CaO was selected as alkaline earth metal oxide additive. While their sum is maintained 6 mol %, a mixture ratio was changed, a result of which is as shown in below Table 3.

TABLE 3

| Sample No | Glass Composition (Mole %) | | | | | Melting (at 1600° C.) | Tg (° C.)/ Ts (° C.) | dielectric constant (@ 1 MHz) | dielectric loss (%) (@ 1 MHz) |
|---|---|---|---|---|---|---|---|---|---|
| | $SiO_2$ | $B_2O_3$ | $Al_2O_3$ | CaO | ZnO | | | | |
| 3A | 70.00 | 22.00 | 2.00 | 0.00 | 6.00 | ○ | 614/701 | 4.052 | 0.21 |
| 3B | 70.00 | 22.00 | 2.00 | 1.00 | 5.00 | ○ | 622/709 | 4.102 | 0.16 |
| 3C | 70.00 | 22.00 | 2.00 | 2.00 | 4.00 | ○ | 625/710 | 4.153 | 0.13 |
| 3D | 70.00 | 22.00 | 2.00 | 3.00 | 3.00 | ○ | 637/718 | 4.204 | 0.06 |
| 3E | 70.00 | 22.00 | 2.00 | 4.00 | 2.00 | ○ | 650/727 | 4.255 | 0.07 |
| 3F | 70.00 | 22.00 | 2.00 | 5.00 | 1.00 | ○ | 664/737 | 4.306 | 0.14 |
| 3G | 70.00 | 22.00 | 2.00 | 6.00 | 0.00 | ○ | 684/755 | 4.306 | 0.15 |

Melting was easily made at the temperature of 1600° C. and a glass transition temperature was 700–760° C. An electrical property of a measured glass test sample shows a dielectric constant of 4.0–4.4, a low regular dielectric constant. A dielectric loss value was about 0.06–0.2, exhibiting an excellent value.

Compared to the prior art, in the present invention, addition of only the alkaline earth metal oxide (RO) was led to obtain the low dielectric loss value, while addition of alkali oxide ($R_2O$) was completely excluded.

Figure 2:
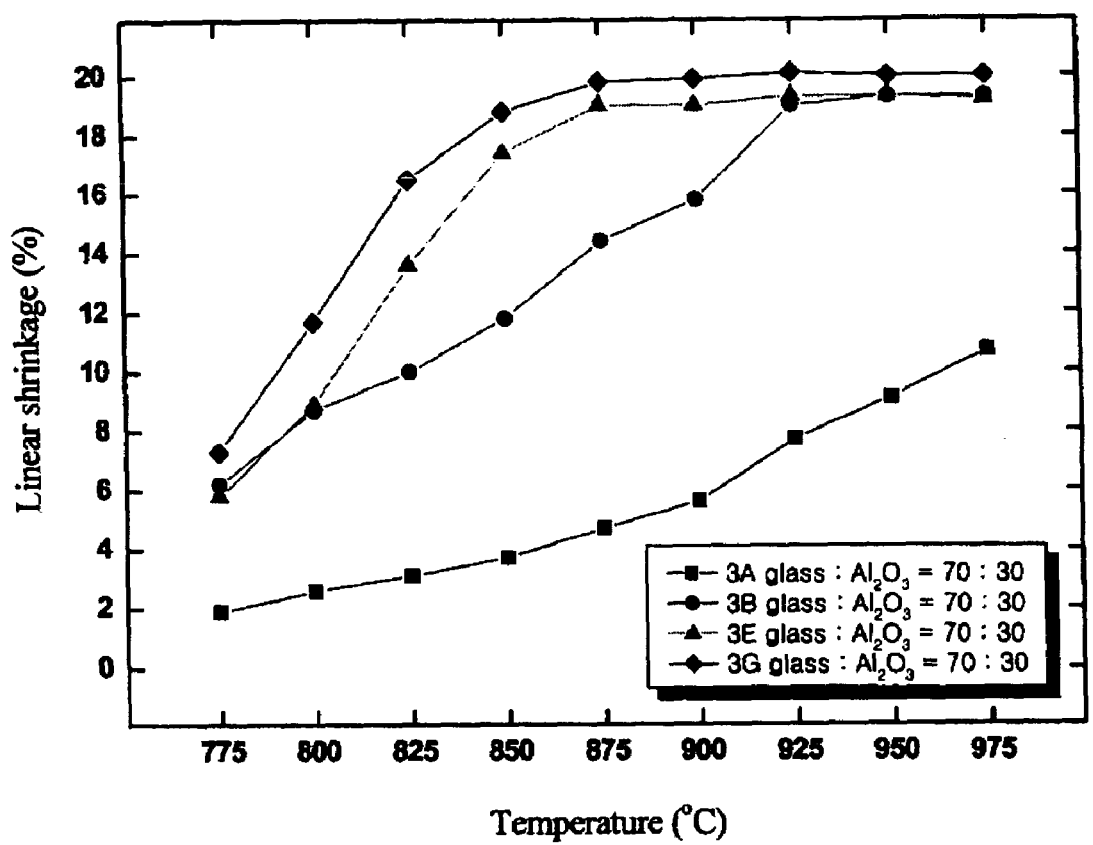
FIG. 2 is a graph showing a linear shrinkage of ceramics measured according to a firing temperature in accordance with the present invention.

FIG. 2 is a graph showing a linear shrinkage of a test sample, in which a glass composition as shown in Table 3 and a 30 weight % alumina filler are mixed, as measured according to a firing temperature in accordance with the present invention.

In the glass composition, the more the addition amount of CaO increase, the lower the on-set temperature for linear shrinkage goes down.

In general, in firing LTCC, if more than 16% linear shrinkage takes place, it is regarded as a complete densification.

Comparison between application of 3B glass composition and 3G glass composition shows that temperatures at which more than 16% linear shrinkage takes place are 900° C. and 825° C., making a big difference of about 100° C. therebetween.

In the mean time, an electrical property of an LTCC substrate using the composition in accordance with the present invention as shown in Table 4 shows that it has a quite low dielectric loss value of below 0.06%.

TABLE 4

| Sample No | Glass | | Filler | | Firing Temperature (° C.) | Electrical Properties | |
|---|---|---|---|---|---|---|---|
| | Type | mole % | Type | wt % | | dielectric constant (@ 1 MHz) | dielectric loss (%) (@ 1 MHz) |
| 1 | 3B | 60 | $Al_2O_3$ | 40 | 960 | 5.6 | 0.09 |
| 2 | 3B | 65 | $Al_2O_3$ | 35 | 925 | 5.4 | 0.08 |
| 3 | 3B | 70 | $Al_2O_3$ | 30 | 925 | 5.3 | 0.09 |
| 4 | 3G | 60 | $Al_2O_3$ | 40 | 925 | 5.8 | 0.05 |
| 5 | 3G | 65 | $Al_2O_3$ | 35 | 925 | 5.5 | 0.09 |
| 6 | 3G | 70 | $Al_2O_3$ | 30 | 900 | 5.3 | 0.06 |

As so far described, the ceramic dielectric composition in accordance with the present invention has the following advantages.

That is, by controlling the types and addition amount of the alkaline earth metal oxide as shown in Table 3, the linear shrinkage behavior can be considerably controlled while maintaining the electrical property unchanged.

In addition, if the on-set temperatures of linear shrinkage between heterogeneous materials are different as shown in FIG. 1, the hegerogeneous interface is separated during the co-firing process and easily broken down. However, the composition in accordance with the present invention facilitates matching a linear shrinkage with a heterogeneous material having certain shrinkage characteristics.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. Dielectric ceramics comprises:
   a borosilicate-based glass composition comprising 68–72 mol % of $SiO_2$, 20–24 mol % of $B_2O_3$, and 4–12 mol % of the sum of $Al_2O_3$+ an additive, wherein the additive is ZnO and CaO; and
   $Al_2O_3$ as a filler.

2. The dielectric ceramics of claim 1, wherein a linear shrinkage temperature of the dielectric ceramics is changed according to a ratio between CaO and ZnO, and the more the amount of CaO increases, the lower the on-set temperature for linear shrinkage goes down.

3. The dielectric ceramics of claim 1, wherein a rate of the filler is 30–40 wt % to the glass composition.

4. The dielectric ceramics of claim 1, wherein more than 16% linear shrinkage takes place at the temperature of 825–900° C.

* * * * *